United States Patent [19]

Seo et al.

[11] Patent Number: 5,677,881
[45] Date of Patent: Oct. 14, 1997

[54] SEMICONDUCTOR MEMORY DEVICE HAVING A SHORTENED TEST TIME AND CONTOL METHOD THEREFOR

[75] Inventors: Dong-Il Seo, Suwon; Tae-Seong Jang, Busan, both of Rep. of Korea

[73] Assignee: Samsung Electronics Co., Ltd., Suwon, Rep. of Korea

[21] Appl. No.: 507,067

[22] Filed: Jul. 26, 1995

[30] Foreign Application Priority Data

Jul. 27, 1994 [KR] Rep. of Korea ............... 1994-18303

[51] Int. Cl.⁶ ............... G11C 7/00; G11C 8/00; G11C 29/00
[52] U.S. Cl. ............... 365/200; 365/201; 365/225.7; 371/10.3
[58] Field of Search ............... 365/200, 201, 365/225.7, 230.03, 230.06, 96; 371/10.3

[56] References Cited

U.S. PATENT DOCUMENTS

| 5,299,161 | 3/1994 | Choi et al. | 365/201 |
| 5,406,520 | 4/1995 | Tay | 365/200 |
| 5,469,401 | 11/1995 | Gillingham | 365/230.06 |
| 5,550,394 | 8/1996 | Sukegawa et al. | 365/200 |

*Primary Examiner*—David C. Nelms
*Assistant Examiner*—Trong Quang Phan
*Attorney, Agent, or Firm*—Cushman Darby & Cushman, IP Group of Pillsbury Madison & Sutro LLP

[57] ABSTRACT

A semiconductor memory device having a shortened test time and a column selection transistor control method therefor. The semiconductor memory device having a plurality of subarray blocks in row and column directions, the subarray blocks storing a plurality of memory cells, including a row decoder for selecting a row of an arbitrary memory cell of the subarray blocks, a column decoder for selecting a column of an arbitrary memory cell of the subarray blocks, a first circuit for inputting/outputting data to/from a specific memory cell selected by the row and column decoders, a second circuit for dividing the inputted/outputted data into a normal mode and a parallel test mode and inputting/outputting the data, and a column redundancy circuit for constituting a decoding of an address in order to replace a column selection line with a spare column selection line by using only an address input used in the parallel test mode and thereby for activating the spare column selection line to test the memory cells in a wafer state.

4 Claims, 6 Drawing Sheets

SEMICONDUCTOR MEMORY DEVICE HAVING A SHORTENED TEST TIME AND CONTOL METHOD THEREFOR

BACKGROUND OF THE INVENTION

The present invention relates to a semiconductor memory device, and more particularly to a semiconductor memory device having a shortened test time and a column selection transistor control method therefor.

As the integration of a semiconductor memory device is remarkably increased, a test time thereof is proportionally increased. As a result, it has become necessary to shorten the test time. Thus, after the wafer has been fabricated, various methods for shortening the test time in a wafer state have been attempted. Generally, a test in the wafer state is commonly called "a pre-laser test".

A pre-laser test is performed so that the number of defective cells and addresses can be checked after the wafer is fabricated. After determining whether to repair the wafer, repair of the defective cells and addresses is executed utilizing the defect information, so that the package of the device may be completed.

The test method currently used in semiconductor memory devices is well known as a parallel test method, which is dependent upon the number of data input/output lines transmitting memory cell data in the cell array. Driving capability indicates how much memory cell data is simultaneously loaded to the data input/output lines by a column selection line, when the word line is enabled. However, this test method requires a large amount of time for testing all of the chip arrays within the chip, since the number of data input/output lines is limited on the chip architecture. The technology of the parallel test method is disclosed on page 240 to 241 in a paper entitled "1985 IEEE International Solid-State Circuits Conference Digest Of Technical Papers" and published by Mastic Kumanoya, et al.

Meanwhile, the afore-mentioned pre-laser test cannot be performed in the parallel test method. As well known in the art, the parallel test method is defined by the standard of JEDEC (Joint Electron Device Engineering Council). The parallel test method is performed as follows: first, the address corresponding to the least significant bits among addresses and column addresses not being used by modes (x1, x4, x8, . . . ) is ignored; second, the cell data are compared with each other by determined modes (x16, x32, . . . ); finally, the compared result is checked. For example, when a read/write operation is performed in a 16M dynamic RAM, the modes (x1, x4, x8, x9, . . . ) are determined by the number of data input/output lines inputting/outputting data at a time, but the x16 mede is determined using the parallel test method. The reason why the parallel test method uses the x16 mede is that address information on the defective cell in the parallel test method does not correspond to address information on repairing for the defective cell in a column redundancy method. Thus, in a pre-laser test method the chip is tested in accordance with the mode.

FIG. 1 is a block diagram showing an array structure and a data output path of a conventional semiconductor memory device, which diagram is commonly used in the art. Under the block structure, description of the x4 mode will be given. It is assumed that data inputted/outputted to/from a zero array block is read out and written through a pad DQ0, data to/from a first array block is through a pad DQ1, data to/from a second array block is through a pad DQ2, and data to/from a third array block is through a pad DQ3. In response to the input of a row address, if a specific word line W/L is selected, a bit line B/L is developed by a bit line sense amplifier (B/LSA) disposed in a subblock where the selected word line exists. Further, a column selection line (not shown) decoded by the column address connects the bit line and a data input/output line. In the meanwhile, bit line data is loaded on a line DO by means of an input/output sense amplifier I/O SA corresponding to the above-mentioned column address, and finally outputted through the pads DQ by means of a data output buffer (not shown). Because of the x4 mede, single data is inputted/outputted to and from each of the array blocks. However, for performing the x16 parallel test, four data are simultaneously inputted/outputted to/from each of the array blocks. In the course of the input/output, the parallel test is not compatible with the column redundancy method in the conventional art.

FIG. 2 is a circuit diagram showing a structure of an array and column redundancy circuit in the conventional art, which illustrates a connection method of column selection transistors. Herein, one array block among the four array blocks of FIG. 1 is described in detail. It is assumed that the input/output sense amplifier I/O SA is selectively operated by the LSBs CA0 and CA1 of the column addresses, the LSB of a column selection line CSLi is CA1, and the column selection lines CSL0 and CSL 1 are different in the input of the column address CA1 and identical to each other in the inputs of another column addresses. Since the single data is inputted/outputted in the x4 mode, the column selection line CSL0 is activated and only the single sense amplifier in the input/output sense amplifiers I/O SA 0 and 1 is operated. On the other hand, since four data are inputted/outputted in the x16 mode, two column selection lines CSL are activated and all of the input/output sense amplifiers I/O SA 0, 1, 2, and 3 are operated. In this case, two column selection lines CSL should necessarily be activated. In this respect, the parallel test is not performed upon the pre-laser test operation. In other words, the LSB of the column address line CSL is dependent upon the column address CA1. Since the column redundancy circuit is divided into two column addresses CA1 and $\overline{CA1}$, if the parallel test method is introduced upon the pre-laser test, the two column selection lines CSL are activated. At this time, when sensing the defect of the cell, the column selection line CSL does not recognize whether the cell activated by the column address $\overline{CA1}$ is defective, or the cell activated by the column address CA1 is defective, so that the repair information therefor may not be recognized. In other words, it is not known whether the information on the defective cell is outputted through the column selection transistors switched by a control of the column selection line CSL0 or through the column selection transistors switched by a control of the column selection line CSL1. This can be easily understood through a connection method of the column selection transistors 20 of FIG. 2. FIG. 3 shows a circuit diagram of a redundancy column selection line enable circuit. In the Figure, it will be noted that the column address CA1 is inputted to one input of a NOR gate 26. Therefore, in the conventional art, a redundancy column selection line SCSL is determined by the input of the column address CA1, which address is ignored upon parallel test (it is obvious to those skilled in the an that the address ignored upon parallel test is defined by the JEDEC's standard). Under the conventional array structure, the address information upon the pre-laser test and column redundancy method does not correspond to each other, thereby making it impossible to reduce a period of the pre-laser to test time and further making productivity of the device seriously deteriorated.

SUMMARY OF THE INVENTION

It is an object of the invention to provide a semiconductor memory device which is capable of reducing a period of test time to the minimum and a column selection transistor control method therefor.

It is another object of the invention to provide a semiconductor memory device which is capable of reducing a period of pre-laser test time to the minimum and a column selection transistor control method therefor.

It is a further object of the invention to provide a semiconductor memory device which is capable of reducing a period of test time by performing a parallel test upon a pre-laser test, and a column selection transistor control method therefor.

It is a yet object of the invention to provide a semiconductor memory device which is capable of improving the productivity thereof by performing a parallel test upon a pre-laser test, and a column selection transistor control method therefor.

To attain these and other objects, a semiconductor memory device according to the present invention comprises a column redundancy circuit having the same structure as the address used upon the parallel test.

A column selection transistor control method according to the present invention is processed in such a manner that the switching operation of the transistor may be controlled by the output of the column redundancy circuit having the same structure as the address used upon the parallel test.

BRIEF DESCRIPTION OF THE DRAWINGS

The following is a detailed description of this invention by the reference of the attached drawings, in which like numbers indicate the same or similar elements:

FIG. 2 is a circuit diagram illustrating a conventional chip array and a column redundancy circuit;

FIG. 3 is a circuit diagram of a redundancy column selection line enable circuit of FIG. 2;

DETAILED DESCRIPTION OF THE PREFERRED EMBODIMENT

In the following description, numerous specific details, such as a column redundancy circuit, a redundancy column selection line enable circuit and a column address transfer circuit and so on, are set forth in order to provide a thorough understanding of the present invention. It will be understood by those skilled in the art that other embodiments of the present invention may be practiced without these specific details, or with alternative specific details.

Figures 2, 3:
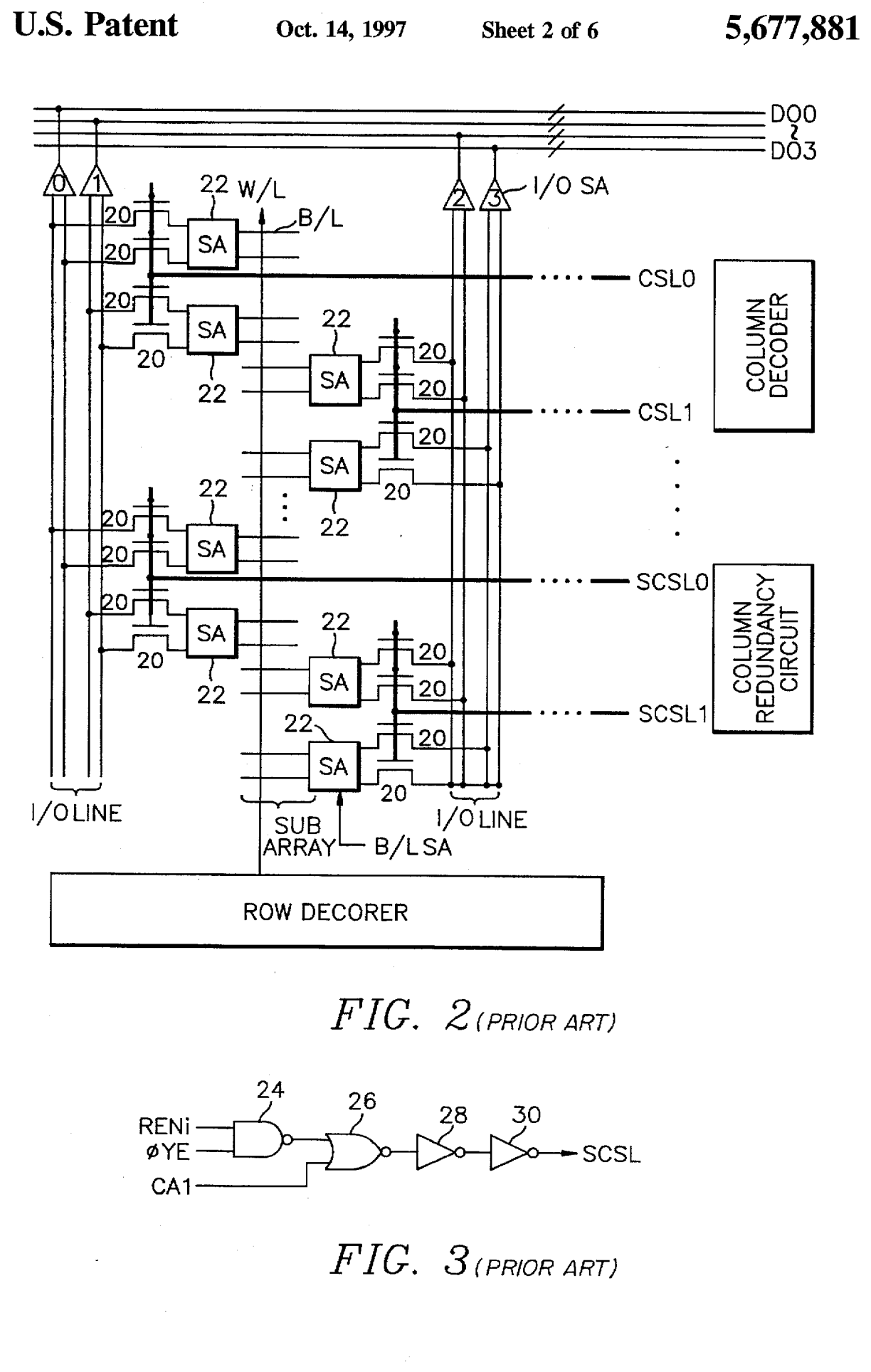
Figure 4:
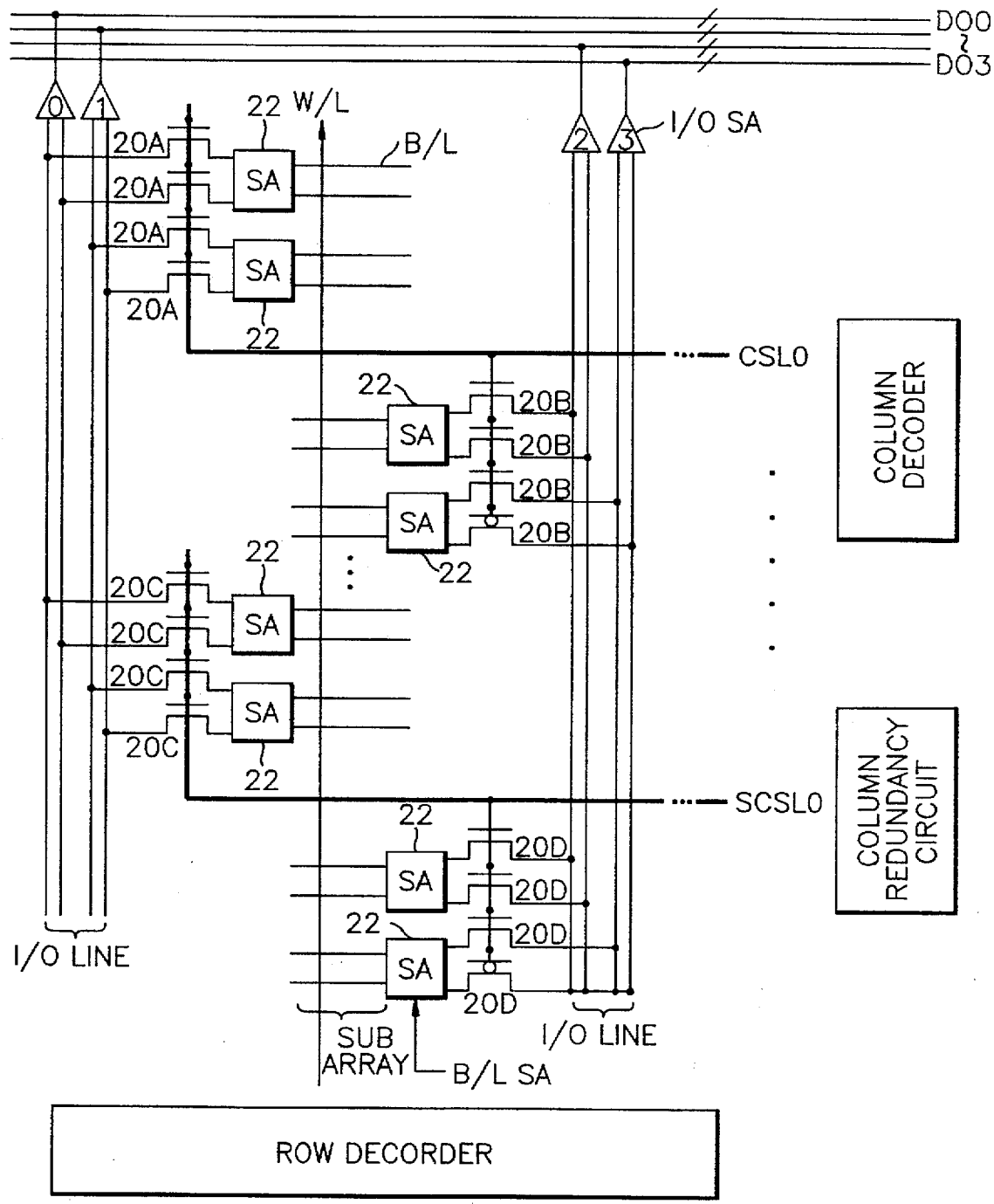
FIG. 4 is a circuit diagram illustrating a chip array and a column redundancy circuit according to the present invention.

FIG. 4 is a circuit diagram illustrating a chip array and a column redundancy circuit according to the present invention. In the Figure, it should be noted that an address input used upon a parallel test is same as that of column redundancy method. A column selection line CSL0 is coupled to all of eight column selection transistors, as commonly coupled to the column selection transistors 20A and 20B. In the same manner as the above, a redundancy column selection line SCSL0 is coupled to all of eight redundancy column selection transistors, as commonly coupled to the redundancy column selection transistors 20C and 20D. In this respect, it can be understood that the above-described structure of FIG. 4 is different from the conventional structure of FIG. 2, and according to the column selection transistor control method according to the present invention, the number of column selection lines CSL is reduced by half of the conventional number thereof. As shown in FIG. 4, except that the normal column selection line CSLi (where i=1,2,3, . . . ) is coupled to the column selection transistors, a generating circuit thereof and a decoding process, and so on may be formed to have the same structure as the conventional ones. It should be noted however, that through the novel column selection transistor control method according to the present invention, the address information on the defective cell upon the parallel test one by one corresponds to that upon the column redundancy method, thereby performing the parallel test upon the pre-laser test.

A method for reducing the test time according to the present invention will be in detail described with reference to FIG. 4.

The column selection lines CSLi and the redundancy column selection lines SCSLi are constructed to be activated without having the inputs of the column addresses CA0 and CA1 which are ignored (don't care) upon the parallel test. One of four input/output sense amplifiers I/O SA is constructed to operate by the column addresses CA0 and CA1, in the same manner as the conventional one. In the x4 mode, the column selection line CSL0 is enabled and the input/output sense amplifier I/O SA is selectively operated. This results in the same operation as the conventional art. In the x16 parallel test, if the column addresses CA0 and CA1 are ignored and one of the column address lines CSLi is activated by the remaining column addresses, four data are outputted through the input/output sense amplifier I/O SA, thereby making it possible to perform the x16 parallel test. If the defective cell is generated, the repair operation is performed by using the column redundancy circuit. At this time, the block to be repaired can be recognized by determining the pad DQ. In the x1 mode, the defective block is accurately recognized because the pad DQ is not separated by each of blocks. However, if operated in the x4 mode by utilizing a bonding option, the parallel test can be performed upon the pre-laser test in the wafer state. Since a method for changing the mode by using the bonding option is widely executed, the detailed explanation on the method will be avoided.

Figure 5:
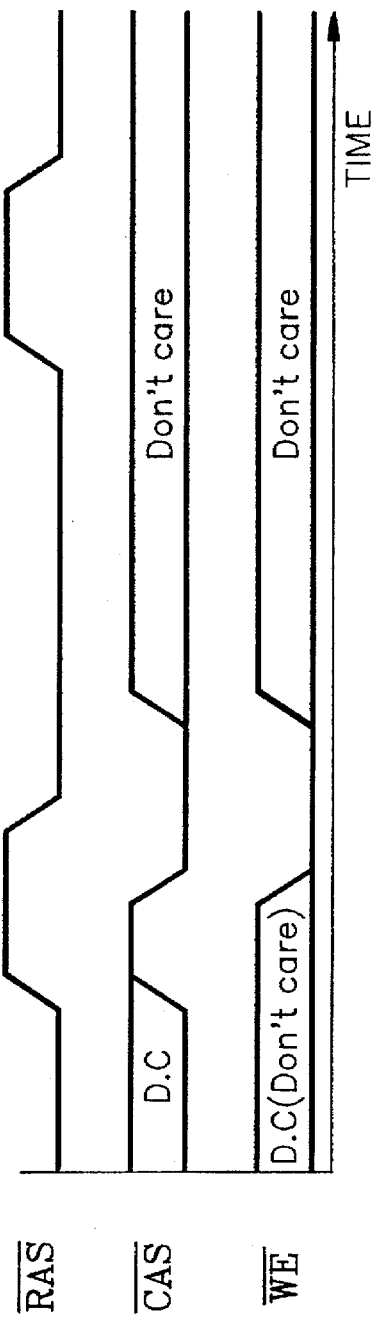
FIG. 5 is a timing diagram illustrating signals generated upon a test operation in the structure of FIG. 4.

FIG. 5 is a timing diagram illustrating signals generated upon a test operation in the structure of FIG. 4, which represents a timing condition commonly used in the related art.

An explanation of the process of enabling the column redundancy in applying the column selection transistor control method of the semiconductor memory device according to the present invention will be described hereinafter.

Figure 6:
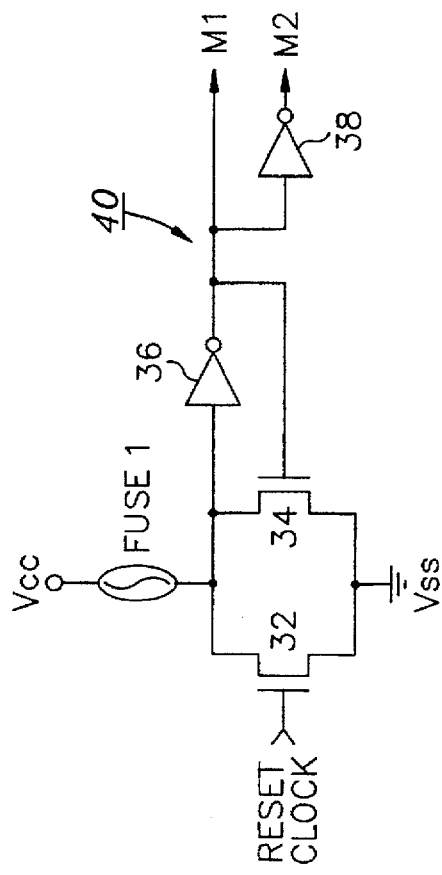
FIG. 6 is a circuit diagram illustrating a master clock generating circuit according to the present invention.

FIG. 6 shows an embodiment of a master clock generating circuit 40 for enabling the column redundancy. A reset clock is once inputted in one operational cycle and generated in a short pulse manner. When a fuse 1 serving as a master fuse is not cut off, the output of an inverter 36 is in a logic "low" state, but as executed for the redundancy, when the fuse 1 is cut off, output signals M1 and M2 are outputted in the logic "high" and "low" states, respectively.

Figure 7:
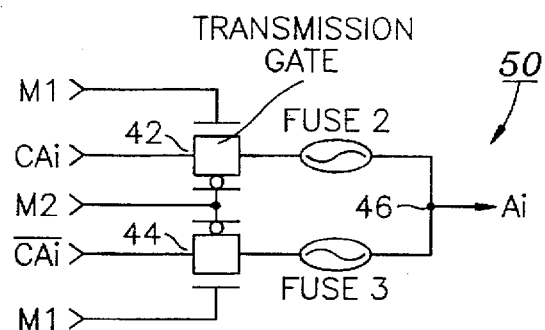
FIG. 7 is a circuit diagram illustrating a column address transfer circuit according to the present invention.

A method of selecting the address to be repaired is embodied with reference to FIG. 7, which is a circuit diagram illustrating the column address transfer circuit according to the present invention. In the structure, transmission gates 42 and 44 being under the control of the output signals M1 and M2 are each disposed on paths where the column addresses CA1 and $\overline{CA1}$ are respectively inputted. Through the transmission gates 42 and 44, fusees 2 and 3 are each disposed on the paths where the column addresses CA1 and $\overline{CA1}$ are respectively outputted. By selectively cutting the fuses 2 and 3, only a single column address is outputted to an output node 46. The levels of the output signals M1 and M2 of the master clock generating circuit 40 are determined by the master fuse 1. When the master fuse 1 is cut of, the transmission gates 2 and 3 are respectively turned on. At this time, since one of the fuses 2 and 3 is selectively cut according to the address information, the repair address is transmitted to the output node 46.

Figure 8:
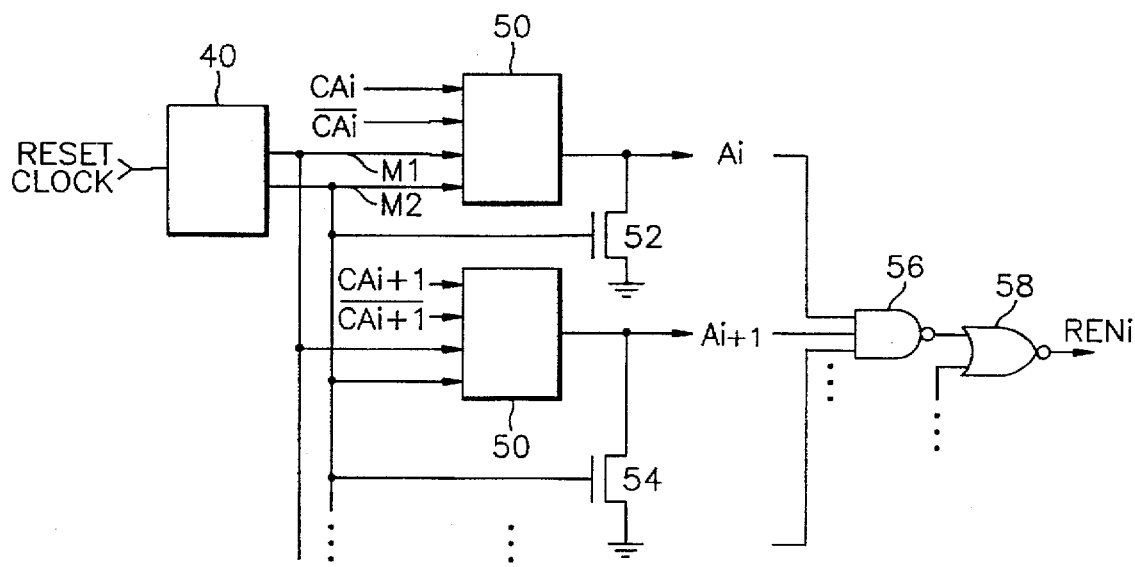
FIG. 8 is a circuit diagram illustrating a redundancy column address enable circuit according to the present invention.

The circuit for enabling the redundancy by using the circuits shown in FIGS. 6 and 7 is embodied by FIG. 8, which is a circuit diagram illustrating a redundancy column address enable circuit according to the present invention. This is realized by combining the circuits of FIG. 6 and FIG. 7. Since all of the output signals Ai (where i=1,2,3, ... ) of the column address transfer circuit 50 are in the logic "low" state by the output signal M2 before the master fuse 1 is cut off, a redundancy enable signal RENi is disabled, i.e., in the logic "low" state. In the meanwhile, after the master fuse is cut off, if the column address is determined by the fuses 2 and 3 and the output signals Ai, Ai+1, . . . are in the logic "high" state, the redundancy enable signal RENi is enabled, i.e., in the logic "high" state in correspondence with the output of the logic "low" state of a NAND gate 56. It is appreciated that a part in the redundancy column address enable circuits is shown in FIG. 8, but a plurality of circuit such as the column address transfer circuit 50 of FIG. 7 are provided. Further, it can be understood that other NAND gates (not shown) different from the NAND gate 56 of FIG. 8 may be provided and simultaneously the outputs of the another NAND gates are inputted to the input of the NOR gate 58.

Figure 9:
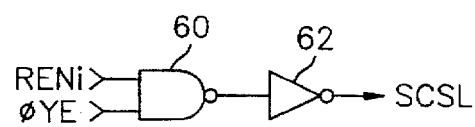
FIG. 9 is a circuit diagram illustrating a redundancy column selection line enable circuit according to the present invention.

The circuit for selecting a specific redundancy column selection line SCSL from the output signal RENi of the redundancy column address enable circuit of FIG. 8 is embodied by a redundancy column selection line enable circuit as shown in FIG. 9. In the structure, there are provided a NAND gate 60 for inputting the output signal RENi and a column enable signal $\phi$YE, respectively and an inverter 62 for inputting the output of the NAND gate 60 and outputting a redundancy column selection line SCSL. When the structure of FIG. 9 is compared with that of FIG. 3, it ma be noted that the input of the column address CA1 is not necessary in the redundancy column selection line enable circuit according to the present invention. That is, referring to FIG. 2, the redundancy column selection line SCSL is determined by the input of the column address CA1, thus to separate the redundancy enable signal RENi generated by the column address CA1 and generated by the column address $\overline{CA1}$. To the contrary, the column address CA1 ignored upon the parallel test is omitted in the present invention, thus to perform the parallel test.

In the meanwhile, as a column address used upon the column address in the column addresses for enabling the column selection line CSL is omitted, it can be appreciated that the pattern for enabling the normal and redundancy column selection lines can be maintained to the same manner as each other.

Furthermore, it can be appreciated that the semiconductor memory device according to the present invention has the same operation as the conventional art, except for the control method of the column selection transistor by utilizing the circuits shown in FIGS. 6 to 9.

Figure 1:
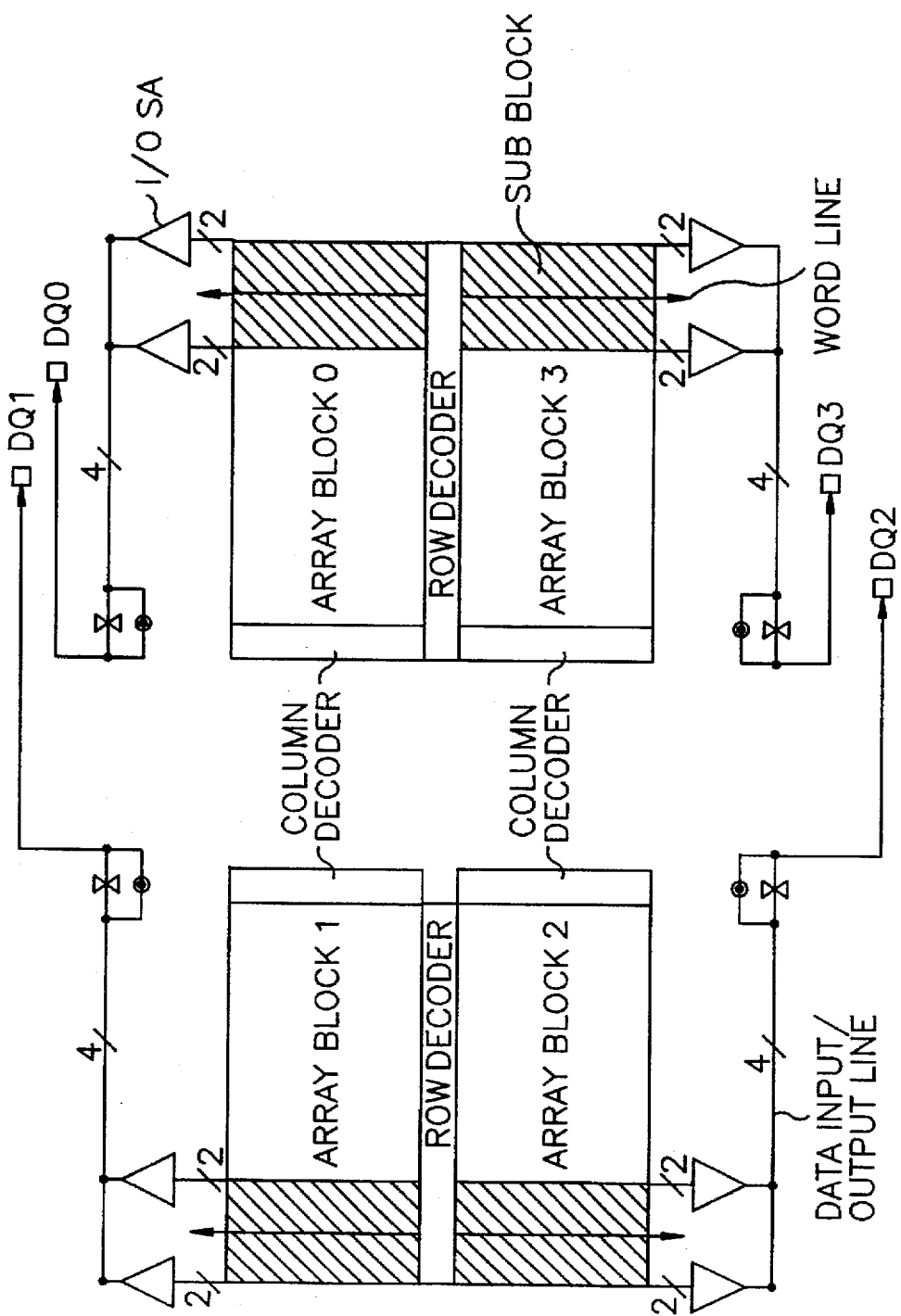
FIG. 1 is a block diagram illustrating typical chip arrays and data output paths in a conventional semiconductor memory device.

Results obtained from the preferred embodiment of the present invention will be described. If the structure of FIG. 4 according to the present invention is made as that of FIG. 1, the number of the column selection lines is reduced to a half and thereby the power line positioned in the array is greatly strengthened. Furthermore, the embodiment of the logic can be made in a simple manner due to the address ignored in the column decoder, and the area occupied within the on chip by the column redundancy circuit can be reduced to a half. The feature of the present invention compared to the conventional art is given by the following Table <1>.

TABLE 1

| ITEM | Conventional Art | Present Invention |
| --- | --- | --- |
| Pre-laser test time | T | M × T/P |
| The Number of CSL | m | m/2 |
| Column Redundancy Circuit | N | N/2 |
| Column Repair Efficiency | N/2 ~ N | N/2 |

(Where M represents a mede and P represents a parallel test method)

Figure 10A:
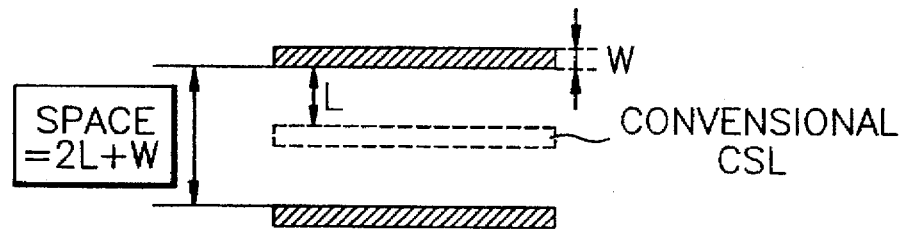
FIGS. 10A and 10B are schematic views illustrating results caused from the reduction of the number of column selection lines according to the present invention.
Figure 10B:
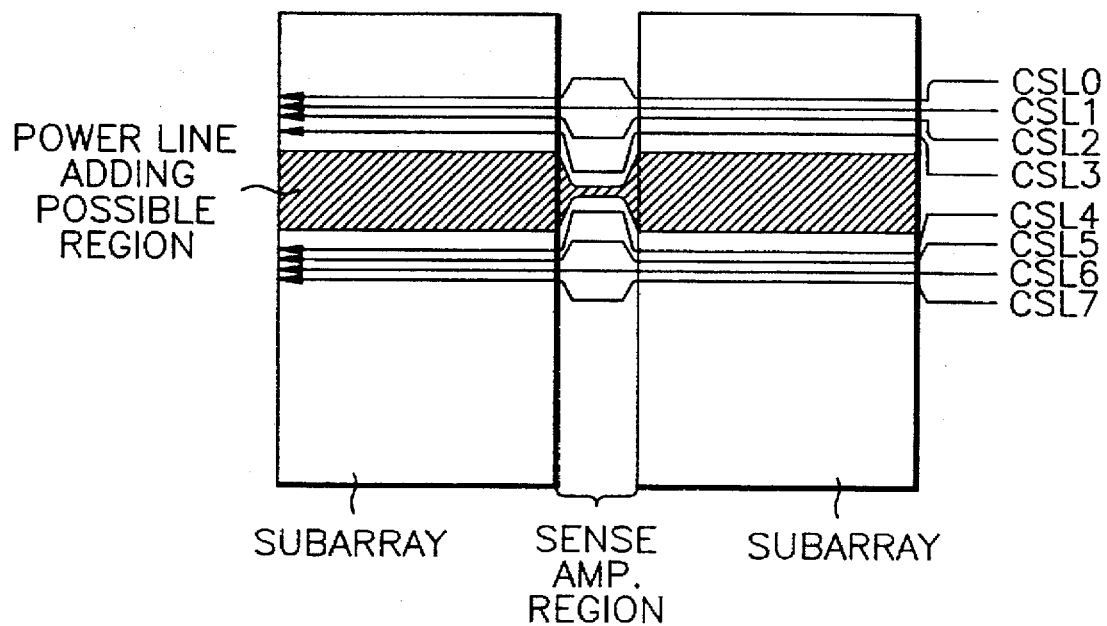

FIGS. 10A and 10B are schematic views illustrating results caused from the reduction of the number of column selection lines according to the present invention. Referring to FIG. 10A, as the distinction between the column addresses CA1 and $\overline{CA1}$ disappears, the number of the column redundancy circuits can be reduced. Additionally, as the structure of the normal column selection line is the same as that of the redundancy column selection line, the number of the column selection lines on the cell array can be reduced to a half, as shown in FIG. 10A. By this, the power line of the cell array can be reinforced, as shown in FIG. 10B.

The logic structure of the circuits shown in FIGS. 6 to 9 are constructed through the optimized embodiment of the present invention, but may be embodied through various embodiments and modifications.

As apparent from the above-described description, the semiconductor memory device and column selection transistor control method thereof is capable of greatly reducing the test time, in particular, pre-laser test time of the integrated circuit by performing the parallel test during the pre-laser test. Moreover, the semiconductor memory device and column selection transistor control method thereof can strongly reinforcing the power line of the array by reducing the number of the column selection lines to a half, embody in a simple manner the logic structure due to the address ignored in the column decoder, and reduce the area occupied within the on chip of the column redundancy circuit to a half.

What is claimed is:

1. A semiconductor memory device having a plurality of subarray blocks in row and column directions, said subarray blocks storing a plurality of memory cells, said device comprising:
   - a row decoder for selecting a row of memory cells of said subarray blocks;
   - a column decoder for selecting a column of memory cells of said subarray blocks;
   - a first circuit for inputting/outputting data to/from a specific memory cell in both said selected row of memory cells and said selected column of memory cells during said parallel test mode; and
   - a column redundancy circuit for replacing a column selection line associated with an address used during said parallel test mode with a spare column selection line by decoding only said address used in said parallel test mode, to thereby activate said spare column selection line.

2. The device as claimed in claim 1, wherein said spare column selection line has the same structure as said column selection line activated in said parallel test mode.

3. A column selection transistor control method of a semiconductor memory device having a plurality of subarray blocks in row and column directions, said subarray blocks including a plurality of memory cells, said method comprising the steps of:
   - selecting a row of memory cells of one of said subarray blocks using a row decoder;
   - selecting a column of memory cells of one of said subarray blocks using a column decoder;
   - inputting/outputting data to/from a specific memory cell in both said selected row of memory cells and said selected column of memory cells during a parallel test mode;
   - inputting parallel test mode data; and
   - replace replacing column selection line with a spare column selection line by using an address input used in said parallel test mode, and thereby activating said spare column selection line whereby the parallel test can be performed upon a pre-laser test.

4. The method as claimed in claim 3, wherein said spare column selection line has the same structure as said column selection line activated in said parallel test mode.

* * * * *